United States Patent
Shen

[11] Patent Number: 6,147,491
[45] Date of Patent: Nov. 14, 2000

[54] MRI SYSTEM WITH FRACTIONAL DECIMATION OF ACQUIRED DATA USING A TWO-DIMENSIONAL FOURIER TRANSFORMATION

[75] Inventor: Jie F. Shen, New Berlin, Wis.

[73] Assignee: General Electric Company, Milwaukee, Wis.

[21] Appl. No.: 09/223,220

[22] Filed: Dec. 30, 1998

[51] Int. Cl.[7] .................................................. G01V 3/00
[52] U.S. Cl. ......................................... 324/307; 324/309
[58] Field of Search .................................... 324/309, 307, 324/306, 312, 300; 702/57

[56] References Cited

U.S. PATENT DOCUMENTS

| | | | |
|---|---|---|---|
| 4,599,565 | 7/1986 | Hoenninger et al. | 324/309 |
| 5,512,825 | 4/1996 | Atalar et al. | 324/309 |
| 6,046,591 | 4/2000 | King et al. | 324/309 |

*Primary Examiner*—Christine K. Oda
*Assistant Examiner*—Brij B. Shrivastav
*Attorney, Agent, or Firm*—Quarles & Brady; Christian G. Cabou; Phyllis Y. Price

[57] ABSTRACT

An MRI system acquires NMR signals at a fixed sample rate. The acquired NMR signals are decimated to produce an output NMR signal at a prescribed sample rate. The acquired NMR signal is converted to a two-dimensional array and then transformed to the frequency domain by performing a DFT along one dimension of the array and a FFT along the other dimension. The resulting frequency domain data is filtered to the prescribed bandwidth and Fourier transformed back to the time domain.

7 Claims, 4 Drawing Sheets

MRI SYSTEM WITH FRACTIONAL DECIMATION OF ACQUIRED DATA USING A TWO-DIMENSIONAL FOURIER TRANSFORMATION

BACKGROUND OF THE INVENTION

The field of the invention is nuclear magnetic resonance imaging methods and systems. More particularly, the invention relates to the sampling of acquired NMR signals at prescribed sample rates.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The rate at which the received NMR signals are digitized is an important scan parameter. The signal-to-noise ratio of an NMR image can be improved if the effective bandwidth (which is the inverse of the sampling period per point) is reduced. This is usually accomplished by widening the read-out gradient pulse and reducing the amplitude of the read-out gradient to encode the positions into a narrower bandwidth and to retain the same spatial resolution. The anti-aliasing filters are modified to match the reduced bandwidth and the analog-to-digital conversion (A/D) sample rate is reduced to acquire the same number of samples over the longer read-out gradient pulse. The SNR improvement is proportional to the square root of the bandwidth reduction.

A higher SNR and corresponding lower A/D sample rate is not always desired, since the increase in SNR is accompanied by two disadvantages. First, the minimum echo delay ($TE_{1\ min}$) for the first NMR echo signal is increased due to the widening of the read-out gradient pulse. For some rf spin echo acquisitions the delay is twice what might be expected, since the time between the 90° RF excitation pulse and the 180° RF pulse must also be increased to orient the NMR echo signal at the center of the widened read-out gradient pulse. The lengthening of $TE_1$ is a disadvantage when $T_2$ weighting of the NMR image is not desired. A second disadvantage which accompanies this increase in SNR is an increase in chemical shift artifacts. Since the bandwidth per image pixel is reduced, the frequency difference between lipid and water resonances becomes more significant. For example, at 1.5 Tesla main field strength, the approximately 220 Hertz difference in resonant frequency will appear approximately three times further apart in an image where each image pixel represents a difference in frequency of 42 Hertz rather than 125 Hertz. The result is an increased relative displacement between the lipid structures and the water structures. This displacement can be especially disturbing with images reconstructed from the first NMR echo signal since the second echo signal often has lower lipid signal components due to the shorter $T_2$ decay time of lipids.

To allow maximum flexibility of the SNR, spatial resolution, and field of view of an image, a completely adjustable A/D sampling rate is desirable.

A number of methods have been used in prior MRI systems to enable the A/D sample rate to be precisely adjusted to enable the best image acquisition possible. One approach is to employ an analog-to-digital converter circuit ("ADC") in which the sample rate is adjustable and can be precisely controlled. Such ADCs are expensive.

Another approach is to employ an ADC which has a fixed sample rate far higher than that required to achieve the desired sample rates. In such designs the sample rate is reduced to the prescribed A/D sample rate by using decimation. The decimation ratio (d) is an integer value. Decimation effectively reduces the A/D sample rate to one-half (d=2) by selecting alternate digitized samples, to one-third (d=3) by selecting every third digitized sample, to one-fourth (d=4) by selecting every fourth digitized sample, etc. The difficulty with this method is that the effective A/D sample rate can only be changed in discrete steps. If the ADC sample rate is very high and the decimation ratio (d) necessary to achieve operable A/D sample rates is very high (e.g. d=10, 11, 12), these discrete steps are relatively small and a desired A/D sample rate can be achieved with reasonable accuracy. However, ADC devices that operate at such high sample rates are expensive.

Another known method for decimating a signal sampled at a high sample rate is to Fourier transform the signal, filter out the high frequency components and Fourier transform the filtered frequency domain signal back to the time domain. While straight forward in principle, this method is impractical because discrete Fourier transforms ("DFT") are required and these take too much time to perform on the large image data sets employed in MRI systems.

SUMMARY OF THE INVENTION

The present invention is a method for using a fixed sample rate ADC to acquire NMR image data and produce an image data set at a prescribed sample rate. More specifically, the method includes acquiring an NMR signal as a sequence of M samples, converting the sequence of M samples into a two-dimensional array of samples having one dimension equal to an odd integer m and a second dimension equal to L, a power of 2, where M=mL; producing a frequency domain data set by performing a discrete Fourier transform along the one dimension of the two-dimensional array of samples and performing a fast Fourier transform along the second dimension of the two-dimensional array of samples; filtering the frequency domain data set to a selected bandwidth; and inverse Fourier transforming the filtered frequency domain data set.

The dimensions m and L of the two-dimensional array of samples are selected such that L is the largest number possible. As a result, m is small and the discrete Fourier transform can be performed quickly along the one small dimension. Since the second dimension of the array has L elements and L is a power of 2, a fast Fourier transform can be performed.

GENERAL DESCRIPTION OF THE INVENTION

Figure 1:
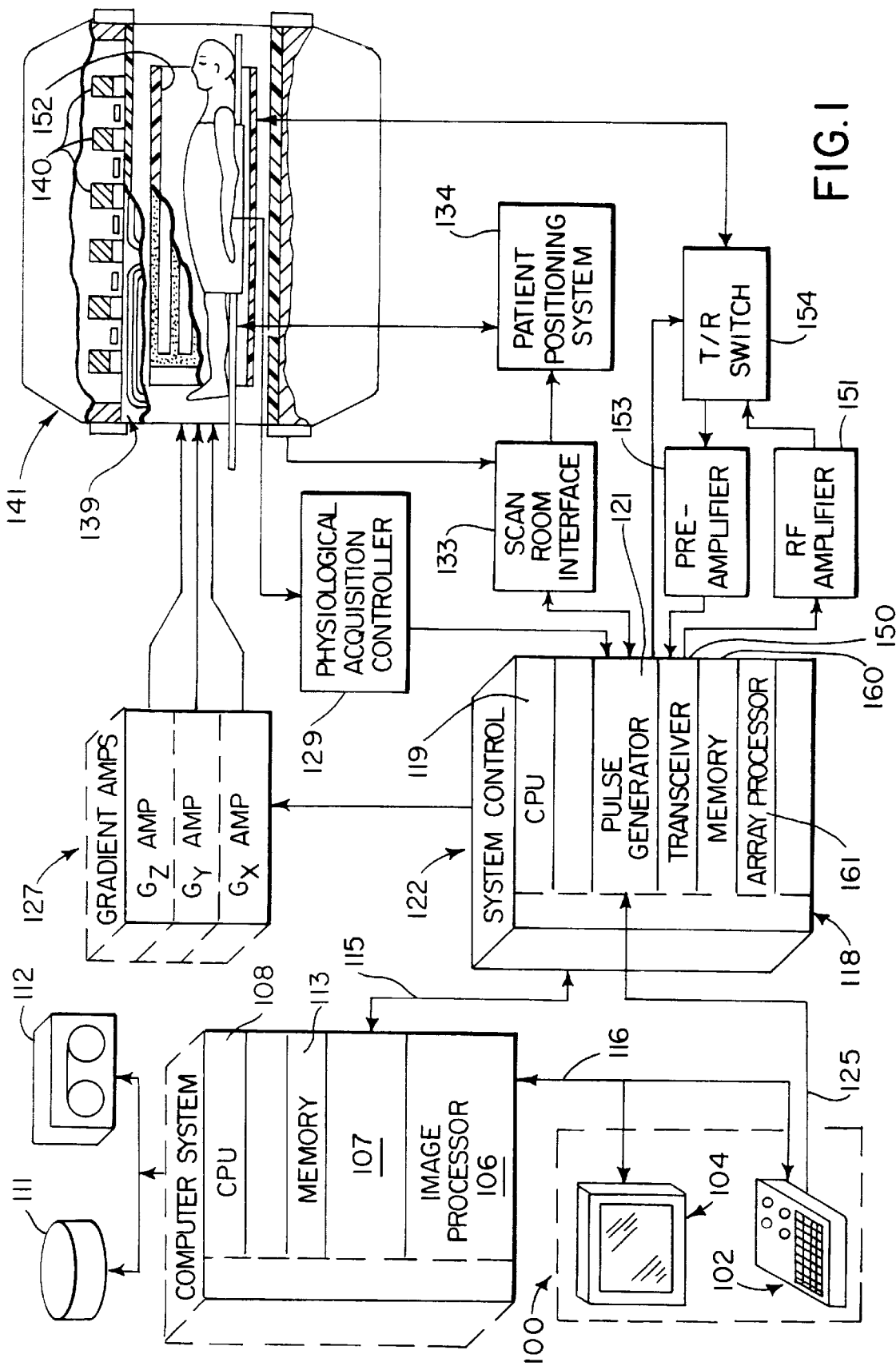
FIG. 1 is a block diagram of an MRI system which employs the present invention.

The present invention reduces the amount of memory and computation time needed to change the sample rate of an acquired NMR signal. The acquired signal is sampled at a fixed rate with a time interval $\Delta t$ between samples. The prescribed sample rate has intervals $m\Delta t/n$, where $m/n$ is the fractional decimation ratio. M samples are acquired and these are to be converted to N samples at the prescribed sample rate, where $N=M*n/m$. The Fourier transform of the M digitized samples is calculated using the two-dimensional Fourier transform according to the present invention, the resulting frequency domain data set is then multiplied by a windowing function, and its data length is subsequently reduced to the desired length N by discarding the high-frequency elements outside the desired bandwidth. Finally, the frequency-domain data, with reduced data length N, is transformed back to the time domain using an inverse Fourier transform. The details of this method are described in the following steps.

The length of a one-dimensional (1D) acquired sequence of NMR samples can be expressed as a product of two integers, an odd integer, m, and a power of 2, L. The idea is to convert a 1D sequence of $M=mL$ points into a 2D sequence of L points in one dimension and m points in the other dimension. The discrete Fourier transform (DFT) of the 1D sequence can then be calculated by applying the DFT in the first dimension with m points and applying the fast Fourier transform (FFT) in the second dimension with L points. The resulting 2D FT can be performed much faster than the original 1D DFT because the DFTs in the 2D FT operate on much fewer data points. The specifics of this conversion of the 1D sequence of M acquired samples into a 2D array and the 2D FT performed on the 2D array will now be described in detail.

The discrete Fourier transform of a sequence of M samples, $s_0, s_1, s_2, s_3, \ldots, s_{M-1}$, is given by $$S_k = \sum_{j=0}^{M-1} s_j e^{i2\pi jk/M} \qquad (1)$$

First, M can be factored into two integers, i.e. $M=mL$, where m is an odd integer and L is a power of 2. In general, m can be obtained from M by dividing M by 2 repeatedly until the result becomes an odd integer. This odd integer is m and L is calculated by dividing M by m.

Second, the 1D summation in Eq. (1) can be converted into a 2D summation. Define two new indices, a and b, by $$j=a+bL, \text{ where } a=0, 1, \ldots, L-1, \text{ and } b=0, 1, \ldots, m-1 \qquad (2)$$

and also define a 2D data array, $y_{a,b}$, as $$y_{a,b}=s_{a+bL}. \qquad (3)$$

Then the 1D summation over index j can be rewritten as a 2D summation over indices a and b:

$$S_k = \sum_{a=0}^{L-1} \sum_{b=0}^{m-1} s_{a+bL} e^{i2\pi ak/(mL)} e^{i2\pi bk/m} \qquad (4)$$

$$= \sum_{a=0}^{L-1} \sum_{b=0}^{m-1} y_{a,b} e^{i2\pi ak/(mL)} e^{i2\pi bk/m}$$

If two other indices, p and q, are introduced:

$$k=pm+q, \text{ where } p=0, 1, \ldots, L-1, \text{ and } q=0, 1, \ldots, m-1 \qquad (5)$$

and another 2D data sequence $Y_{p,q}$, is also defined:

$$Y_{p,q}=S_{pm+q}, \qquad (6)$$

Equation (4) becomes $$Y_{p,q} = \sum_{a=0}^{L-1} \sum_{b=0}^{m-1} y_{a,b} e^{i2\pi ap/L} e^{i2\pi aq/(mL)} e^{i2\pi bq/m} \qquad (7)$$

$$= \sum_{a=0}^{L-1} e^{i2\pi ap/L} e^{i2\pi aq/(mL)} \sum_{b=0}^{m-1} y_{a,b} e^{i2\pi bq/m}$$

where the unity equality, $e^{i2\pi bp}=1$, has been used.

The following steps can be used to calculate $Y_{p,q}$ (and hence $S_k$):

Step 1: Convert the 1D input sequence $s_j$ to a 2D sequence $y_{a,b}$ $$y_{a,b}=s_{a+bL}, \text{ where } a=0, 1, \ldots, L-1; b=0, 1, \ldots, m-1 \qquad (8)$$

Step 2: Perform 1D DFTs of length m with respect to index b.

The 1D DFT is repeated L times, once for each value of index a. Let the result be $Y_{a,q}$. Each DFT requires $(m-1)^2$ real, or $(m-1)^2/4$ complex, multiplications. This step requires a total of $L(m-1)^2/4$ complex multiplications.

Step 3: Perform a Linear Phase Shift.

Multiply $Y_{a,b}$ by $e^{i2\pi aq/(mL)}$. (9)

The transformation in Eq. (7) is a 2DFT in addition to a phase shift term. This step removes that phase shift from the frequency domain data. This step requires mL complex multiplications.

Step 4: Perform a 1D FFT of length L with respect to index a. Because L is a power of 2, a FFT can be used over index a. Each FFT requires $(L/2)\log_2$ complex multiplications, and the FFT is repeated m times, once for each value of q. This step requires a total of $(mL/2)\log_2 L$ complex multiplications.

In summary, the total number of complex multiplications required to calculate the Fourier transform of the acquired signal of length $M=mL$ using the above method is given by $$L(m-1)^2/4+mL+(mL/2)\log_2 L. \qquad (10)$$

The next step in the fractional decimation process is to bandlimit the frequency domain signal samples $S_k$ that result from the above Fourier transformation. This is accomplished by multiplying the signal $S_k$ by a window function $H_k$.

$$X_k=H_k S_k, \qquad (11)$$

where $k=0, 1, \ldots, N-1$, and $H_k$ is a windowing function. The frequency range after the data length reduction is $\Delta F=N\Delta f=1/(m\Delta t/n)$, which is the desired receiver bandwidth. This step requires N complex multiplications.

The final step is to Fourier transform the windowed frequency domain data set $X_k$ back to the time domain. Because N is a power of 2, a fast Fourier transform can be used.

$$x_j = \sum_{k=0}^{N-1} X_k e^{-i2\pi jk/N} \quad (12)$$

The time interval is $1/\Delta F = m\Delta t/n$, which is the desired sampling period. This step requires $(N/2)\log_2 N$ complex multiplications.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
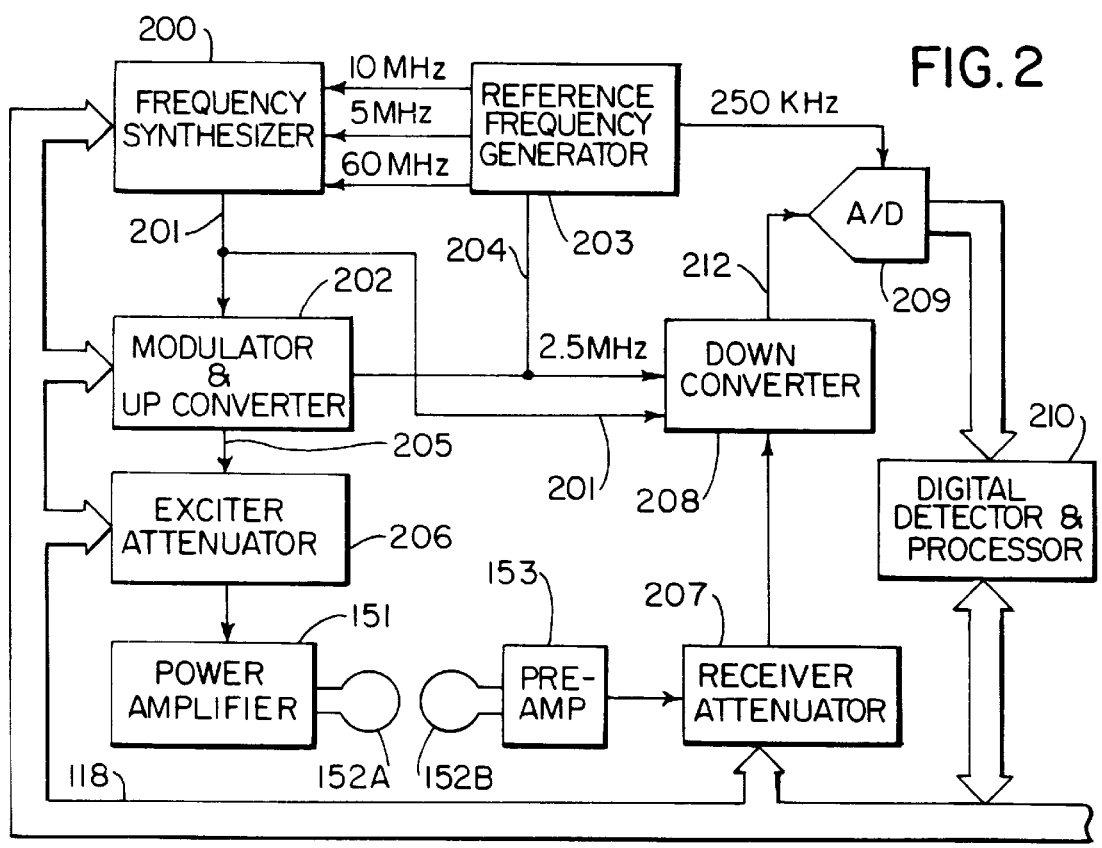
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital converter (ADC) 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received time domain NMR signal are output through backplane 118 to the memory module 160 where they are employed to reconstruct an image. In the preferred embodiment the ADC 209 operates at a fixed sample rate of 500 kHz so that complex pairs I and Q are sampled at a 250 kHz rate (i.e $\Delta t=4$ μsec), yielding a maximum bandwidth of ±125 kHz.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

The present invention is implemented on the digitized I and Q samples of each acquired time domain NMR signal. A prescribed receive bandwidth is established prior to the scan, to provide the desired sampling interval m$\Delta t$/n, and the number (M) of digitized samples is also prescribed. The acquired data is digitized at sampling intervals $\Delta t$ and it is then processed according to the present invention to produce a data set $x_0, x_1, x_2, \ldots, x_{N-1}$ which is a representation of the acquired data digitized at the prescribed sampling interval. This data set is employed in the usual fashion to reconstruct an image at the completion of the scan as described above. The processing of the present invention is thus performed between the acquisition of each view of data and the use of that view in the image reconstruction process. This invention enables any arbitrary bandwidth to be prescribed (less than the fixed bandwidth of the receiver) with minimal impact on the image reconstruction time.

Figure 3:
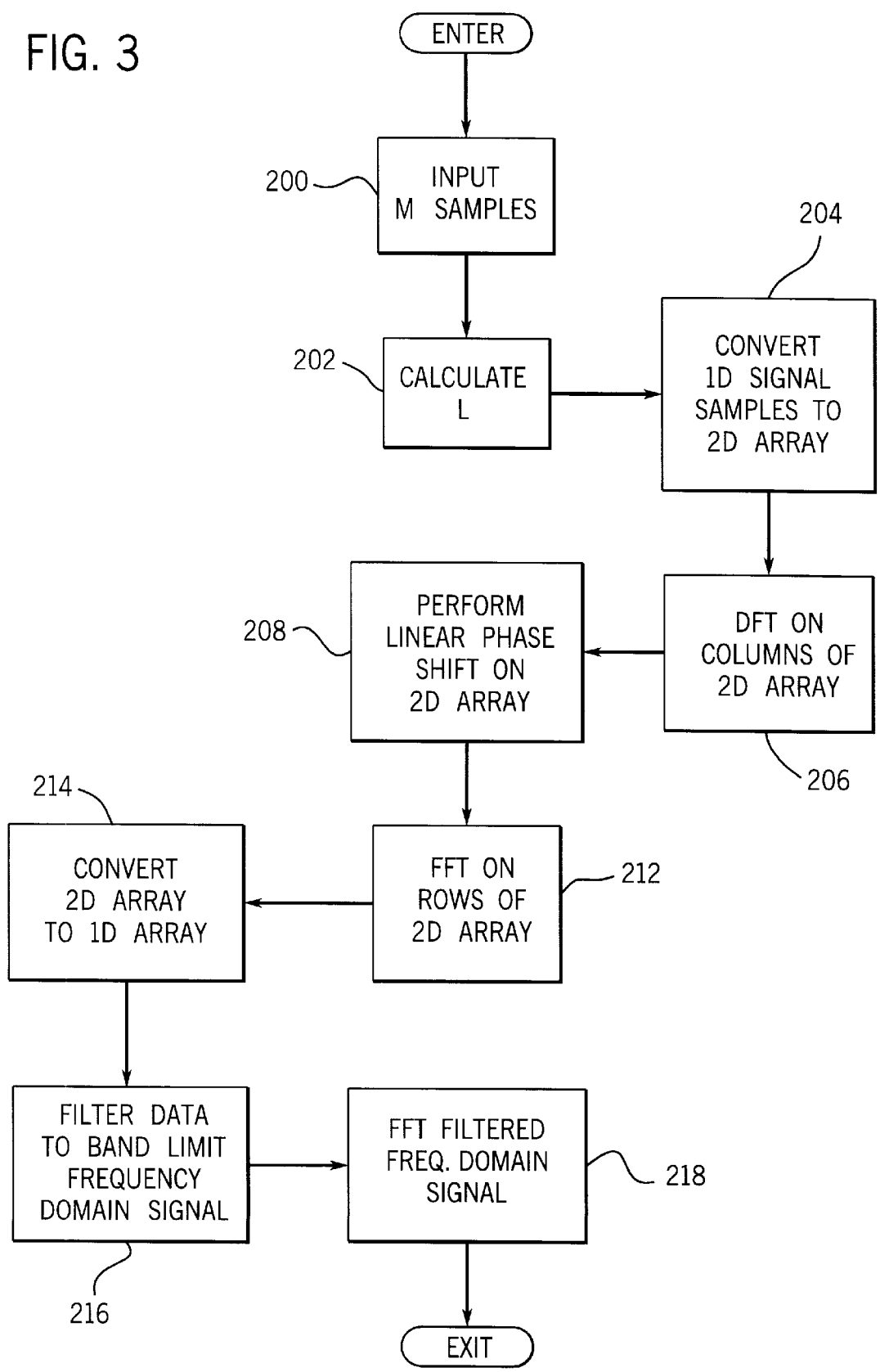
FIG. 3 is a flow chart of a preferred method used by the MRI system of FIG. 1 to practice the present invention.
Figure 4:
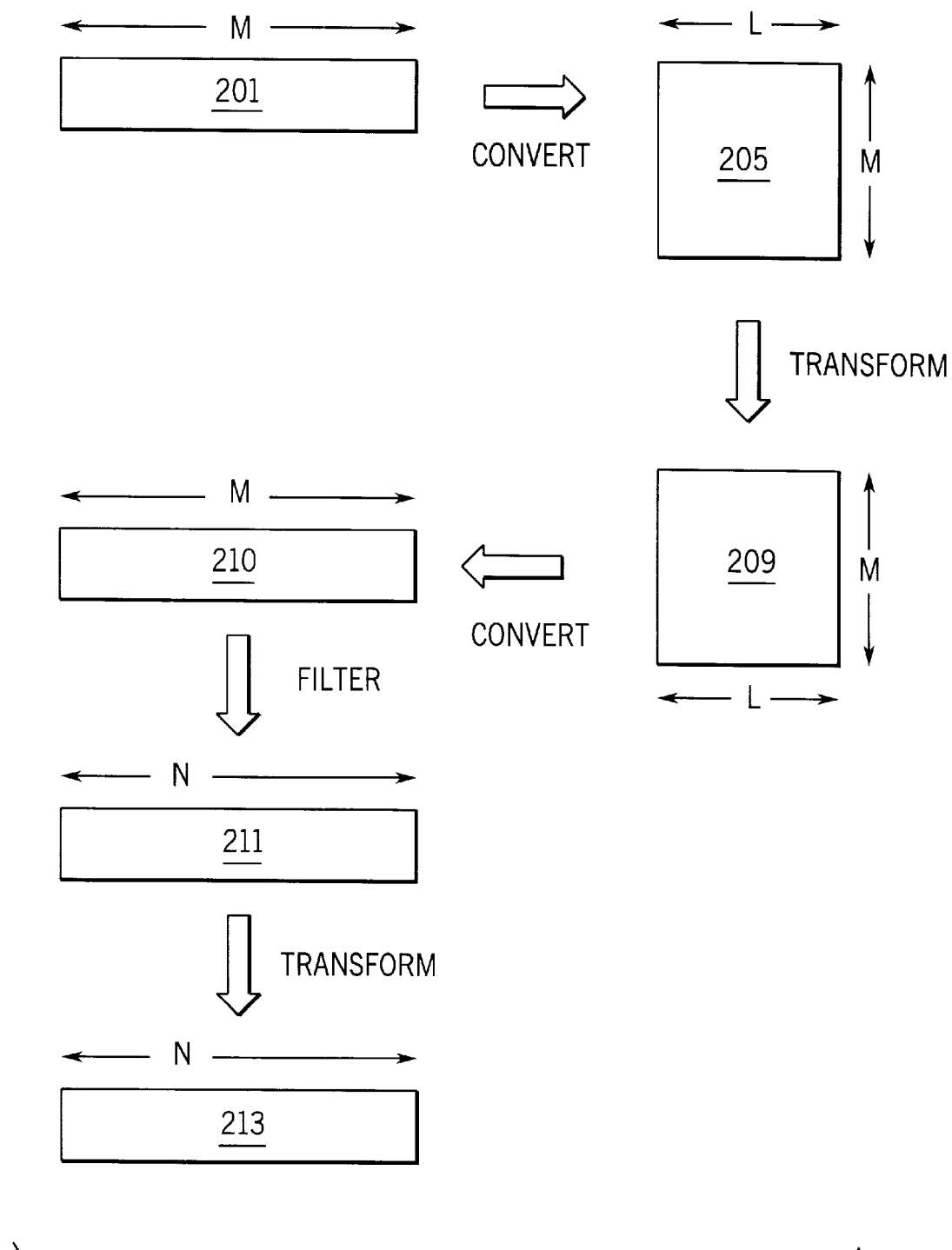
FIG. 4 is a pictorial representation of data structures employed in the method of the method of FIG. 3.

Referring particularly to FIGS. 3 and 4, as each time domain NMR signal is acquired and digitized as described above, the signal samples are input as indicated by process block 200. A total of M time domain signal samples indicated at 201 in FIG. 4 are input and these are to be reduced in number to N using a decimation ratio m/n as described above. The next step indicated at process block 202 is to factor M into two integers, m and L, where L is a power of 2. In the preferred embodiment, m is obtained from M by dividing M by 2 repeatedly until the result becomes an odd integer. For M=320, for example, dividing repeatedly by 2 yields the odd integer "5" which is m. The integer L is then calculated by dividing M by m to yield L=64.

The next step is to convert the one-dimensional time domain signal samples M into a two-dimensional array 205 of time domain signal samples as indicated at process block 204 and Eq. (8) above. The 2D array 205 has L columns and m rows. As indicated at process block 206, a discrete Fourier transformation (DFT) is then performed on each of the L columns in the array 205. Since each column contains a small number of signal samples (m=5 in the above example) each DFT can be performed very quickly. While any DFT method may be used, in the preferred embodiment cosine and sine transforms are used because they require fewer computations. This preferred DFT method will be described in more detail below.

As indicated at process block 208, a linear phase shift is performed on each element in the partially transformed 2D array as set forth above in Eq. (9). The completion of the transformation of the 2D array 205 to a frequency domain array 209 is then accomplished by fast Fourier transforming (FFT) each of the m rows of the array 205 as indicated at 212.

Since each row contains L elements (L=64 in the above example), an FFT can be used because L is a power of 2. The resulting two-dimensional frequency domain array 209 is then converted as indicated at process block 214 to a one-dimensional frequency domain array 210 containing M frequency domain signal samples. This conversion is performed by concatenating the successive L columns of elements in the 2D array 209.

The 1D frequency domain array 210 is filtered as indicated at process block 216 by multiplying by a window function ($H_k$) as indicated above in Eq. (11). This reduces the number of frequency domain samples to N in the resulting frequency domain data array 211 and provides the desired bandwidth. The final step as indicated at process block 218 is to fast Fourier transform the frequency domain data array 211 back to the time domain. The FFT can be used because the data array 211 has N elements and N is initially specified as a power of 2. The resulting N decimated time domain signal samples that are produced in a one-dimensional time domain data array 213 has the prescribed bandwidth and signal sample rate.

The data processing required by the above method can be reduced further by calculating the DFT in process block 206 using cosine and sine transforms. The expression for a DFT is:

$$S_k = \sum_{j=0}^{M-1} s_j e^{i2\pi jk/m} \tag{14}$$

On the surface, it seems to require $m^2$ complex multiplications, m complex multiplications for each of the m values of $S_k$. A careful analysis reveals that the actual number of required complex multiplications can be reduced. First $S_0$ does not require any multiplications. The Fourier transform can be written as the sum of cosine and sine transforms:

$$S_k = S_c(k) + iS_s(k) \tag{15}$$

where $$S_c(k) = \sum_{j=0}^{m-1} s_j \cos(2\pi jk/m) \tag{16}$$

and $$S_s(k) = \sum_{j=0}^{m-1} s_j \sin(2\pi jk/m) \tag{17}$$

It can be shown that $S_c(m-k)=S_c(k)$. The proof is given below:

$$S_c(m-k) = \sum_{j=0}^{m-1} s_j \cos(2\pi j(m-k)/m)$$

-continued $$= \sum_{j=0}^{m-1} s_j \cos(2\pi j - 2\pi jk/m)$$

$$= \sum_{j=0}^{m-1} s_j \cos(2\pi jk/m) = S_c(k)$$

where the equality, $\cos(2\pi j - \alpha) = \cos(\alpha)$ for and integer j and any angle $\alpha$, has been used. Similarly, it can be shown that $S_s(m-k) = -S_s(k)$. Therefore, the second half of the cosine and sine transforms can be obtained from the first half, and no additional multiplications are required for them.

Furthermore, the terms in the summation can be combined to reduce the number of multiplications required. Dividing the summation for $S_c(k)$ into 2 summations of fewer terms, yields:

$$S_c(k) = s_0 + \sum_{j=1}^{(m-1)/2} s_j \cos(2\pi jk/m) + \sum_{j=1+(m-1)/2}^{m-1} s_j \cos(2\pi jk/m).$$

Replacing index j in the second summation by m−j yields:

$$S_c(k) = s_0 + \sum_{j=1}^{(m-1)/2} s_j \cos(2\pi jk/m) + \qquad (19)$$

$$\sum_{j=(m-1)/2}^{1} s_{m-j} \cos(2\pi (m-j)k/m)$$

$$= s_0 + \sum_{j=1}^{(m-1)/2} s_j \cos(2\pi jk/m) +$$

$$\sum_{j=1}^{(m-1)/2} s_{m-j} \cos(2\pi k - 2\pi jk/m)$$

$$= s_0 + \sum_{j=1}^{(m-1)/2} (s_j + s_{m-j}) \cos(2\pi jk/m)$$

where the equality relationship, $\cos(2\pi k - \alpha) = \cos(\alpha)$ for any integer k and any angle $\alpha$, has been used.

Similarly it can be shown that $$S_s(k) = \sum_{j=1}^{(m-1)/2} (s_j - s_{m-j}) \sin(2\pi jk/m). \qquad (20)$$

In summary, the DFT ($S_k$) can be calculated using the following steps:

Step 1: Define two new series, $s_e(j)$ and $s_o(j)$, by $$s_e(0) = s_0, \text{ and } s_e(j) = s_j + s_{m-j} \text{ for } j \geq 1 \text{ and } j \leq (m-1)/2 \qquad (21)$$

and $$s_o(j) = s_j - s_{m-j} \text{ for } j \geq 1 \text{ and } j \leq (m-1)/2 \qquad (22)$$

This step requires m−1 complex additions but no multiplications.

Step 2: Calculate the cosine transform according to $$S_c(k) = \sum_{j=0}^{(m-1)/2} s_e \cos(2\pi jk/m), \text{ for } k \geq 0 \text{ and } k \leq (m-1)/2 \qquad (23)$$

and $$S_c(k) = S_c(m-k), \text{ for } k > (m-1)/2 \text{ and } k \leq (m-1) \text{tm} \qquad (24)$$

Each summation has (m−1)/2 terms requiring 2 real multiplications each. With (m−1)/2 summations to calculate, this step requires $(m-1)^2/2$ real, or equivalently $(m-1)^2/8$ complex, multiplications.

Step 3: Calculate the sine transform according to $$S_s(k) = \sum_{j=1}^{(m-1)/2} s_o \sin(2\pi jk/m), \text{ for } k \geq 0 \text{ and } k \leq (m-1)/2 \qquad (25)$$

and $$S_s(k) = -S_s(m-k), \text{ for } k > (m-1)/2 \text{ and } k \leq (m-1) \qquad (26)$$

This step also requires $(m-1)^2/8$ complex multiplications.

Step 4: Calculate the discrete Fourier transform, $S_k$, according to $$S_k = S_c(k) + iS_s(k) \qquad (27)$$

The total number of complex multiplications required for all 4 steps combined is $(m-1)^2/4$.

When the value of n in the desired decimation ratio m/n is equal to or less than 16, the decimation method of the present invention is 4 to 10 times faster than the zero-padding method and 2 to 4 times faster than the chirp-transformation method. The present invention also requires several times less computer memory space than prior art methods.

What is claimed is:

1. A method for decimating a time domain signal, comprised of a sequence of signal samples acquired at a preset sample rate, the steps comprising:
   a) converting the sequence of signal samples to a two-dimensional array of signal samples having one dimension equal to an odd integer and the second dimension equal to a power of two;
   b) performing a discrete Fourier transform along the one dimension of the two-dimensional array of signal samples;
   c) performing a fast Fourier transformation along the second dimension of the two-dimensional array of signal samples to produce a frequency domain data set;
   d) filtering the frequency domain data set to a selected bandwidth; and
   e) Fourier transforming the filtered frequency domain data set to produce a decimated sequence of time domain signal samples.

2. The method as recited in claim 1 which includes linearly phase shifting the signal samples in the two-dimensional array of signal samples after performing step b) and before performing step c).

3. The method as recited in claim 1 in which the frequency domain data set is a two-dimensional array and the method includes converting the two-dimensional array of frequency domain data to a one-dimensional array of frequency domain data.

4. The method as recited in claim 3 in which the conversion of the two-dimensional array of frequency domain data is performed by concatenating successive columns of the two-dimensional array of frequency domain data.

5. The method as recited in claim 1 in which the number of signal samples (M) in sequence is equal to the product of the one dimension (m) times the second dimension (L) of the two-dimensional array of signal samples.

6. The method as recited in claim 1 in which the discrete Fourier transformation is performed by
   i) defining two series of values $s_e(j)$ and $s_o(j)$ from the signal samples $S_j$ along the one dimension of the two-dimensional array of signal samples;
   ii) calculating the cosine transform $S_c(k)$ of one of the series of values $s_e(j)$;
   iii) calculating the sine transform $S_s(k)$ of the other series of values $s_o(j)$;
   iv) calculating the discrete Fourier transform $S_k$ according to:

$$S_k = S_c(k) + iS_s(k).$$

7. The method as recited in claim 1 in which the number of elements in the filtered frequency domain data set is a power of two, and a fast Fourier transform is performed in step e).

* * * * *